US007514991B2

(12) United States Patent
Schnarr

(10) Patent No.: US 7,514,991 B2
(45) Date of Patent: Apr. 7, 2009

(54) HIGH ACCURACY CURRENT MODE DUTY CYCLE AND PHASE PLACEMENT SAMPLING CIRCUIT

(75) Inventor: Curt Schnarr, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 11/811,980

(22) Filed: Jun. 12, 2007

(65) Prior Publication Data

US 2008/0309375 A1 Dec. 18, 2008

(51) Int. Cl.
*G06G 7/12* (2006.01)
*G06G 7/26* (2006.01)
(52) U.S. Cl. .................. 327/563; 327/560; 327/51; 327/52; 327/54; 327/63; 327/65
(58) Field of Classification Search ................ 327/560, 327/563, 51, 52, 54, 63, 65, 359
See application file for complete search history.

(56) References Cited

U.S. PATENT DOCUMENTS 6,853,220 B2 * 2/2005 De Laurentiis et al. ...... 327/108

* cited by examiner

*Primary Examiner*—Tuan T Lam
*Assistant Examiner*—Daniel Rojas
(74) *Attorney, Agent, or Firm*—Dorsey & Whitney LLP

(57) ABSTRACT

A duty cycle and phase placement sampling circuit that can be used for high accuracy sampling and correcting the duty cycle and placement of differential clock signals is provided. The duty cycle and phase placement sampling circuit includes dual differential input stages and re-timed precharge signals that allow for high accuracy sampling of common mode logic clock phases.

32 Claims, 10 Drawing Sheets

US 7,514,991 B2

HIGH ACCURACY CURRENT MODE DUTY CYCLE AND PHASE PLACEMENT SAMPLING CIRCUIT

TECHNICAL FIELD

Embodiments of this invention relates to duty cycle and phase placement sampling circuits, and, more particularly, to a duty cycle and phase placement sampling circuit having higher accuracy.

BACKGROUND OF THE INVENTION

As the operating speeds of integrated circuits such as memory devices continues to increase, the timing margins for signals applied to and received from the integrated circuits continues to decrease. For example, the period for which a digital signal is valid, known as the "eye," decreases as the data rate increases, thereby making it more difficult for the digital signal to be acquired or captured by a receiving device during the eye. One factor affecting the location of the data eye is "phase jitter," which is high frequency phase noise that causes rapid changes in the timing at which transitions of digital signals occur.

Some devices incorporate high-speed serial links for streaming serialized data between, for example, a test apparatus and an integrated circuit under test. Typically, a clock signal is sent in parallel along with the data stream and is used by the receiver to sample the data stream at the appropriate location within the data eye. Alternatively, methods exist for recovering a clock signal solely from the serialized data itself. In either case, duty cycle variation and timing skew in the clock and data signals can lead to errors in recovery of the data. Likewise, accurate serialization of data within the transmitter relies upon the availability of clock signals with minimal duty cycle variation and timing skew. To provide such clock signals, transmitting and receiving devices must have a means of sampling and correcting the duty cycle and phase placement of clock signals while the devices are operating. As the data rate of such devices increases, the duty cycle and phase placement of derived clocks must be sampled and controlled much more accurately.

In the past, various circuits have been used for sampling duty cycle and phase placement. A typical example of a prior art sampling circuit 100 is shown in FIG. 1. The circuit comprises a pair of differential input transistors 25 and 30, precharge transistors 45 and 50, enable transistor 10, a pair of integrating capacitors 65 and 70. The differential outputs, OUT 40 and OUT* 35, are taken at the node of each capacitor. The circuit also includes two sets of feedback transistors, one set for each differential branch. The NMOS transistor 15 and PMOS transistor 55 are cross-connected to the output node OUT 40 in the other differential branch. Likewise, NMOS transistor 20 and PMOS transistor 60 are similarly cross-connected to OUT* 35.

In operation, an active-low precharge signal is applied to the enable transistor 10 and precharge transistors 45 and 50. The precharge signal turns OFF the enable transistor 10 preventing current flow to ground. Likewise, the precharge PMOS transistors 45 and 50 are turned ON which brings the output nodes OUT* 35 and OUT 40 to Vdd thereby discharging the capacitors 65, 70. This likewise turns on NMOS transistors 15 and 20. A differential current mode clock signal is applied to the inputs CLK and CLK*. The precharge signal is then de-asserted which, in combination with NMOS transistors 15 and 20, provides a path for current to travel to ground. As the input signals CLK and CLK* switch, NMOS transistors 25 and 30 alternately turn ON and OFF thereby charging the integrating capacitors 65 and 70.

As can be seen in FIGS. 2A and 2B, when there is an error in the duty cycle, one of CLK and CLK* signals will be at a logic high level for a longer period of time per cycle than the other. In turn, a greater amount of charge is drained from the associated capacitor 65 or 70 during each cycle of the clock. As a result, the voltage on the output nodes OUT and OUT* diverge over time with one of them being pulled lower faster than the other. Once one side pulls down a sufficient amount more than the other, a positive feedback loop is established that pulls down the lower side even lower while allowing the opposite side to be pulled up to Vdd. Supposing that the duty cycle is as shown in FIG. 2B, and again with reference to FIG. 1, since CLK is high for less time than CLK*, the NMOS transistor 30 will conduct for a greater amount of time per clock period than will NMOS transistor 25. Therefore, the voltage of the output node OUT 40 is reduced faster than the voltage of output node OUT* 35. As the voltage of OUT 40 drops sufficiently low, the cross-coupled NMOS transistor 15 begins to shut off and the PMOS transistor 55 begins to conduct. As the NMOS transistor shuts off, it draws less current from the capacitor 65. Further, as the PMOS transistor 55 begins to conduct, more of the current that is still drawn by the NMOS transistor 15 is provided by the PMOS transistor 55. As a result, less current is drawn from the capacitor 65. The reduced rate at which current is drawn from the capacitor 65 reduces the rate at which the voltage on the output node OUT* 35 is reduced. Conversely, as the voltage at the output node OUT* 35 is reduced slower than the voltage of output node OUT 40, the PMOS transistor 60 provides less current, and more current is drawn by the NMOS transistor 20. Eventually, the PMOS transistor 60 becomes completely shut off and likewise, the NMOS transistor 20 is completely turned ON. This ensures that the output node OUT 40 is fully pulled down. Thus, when the duty cycle of the clock is less than 50%, the output node OUT 40 is pulled down and OUT* 35 is pulled up. Operation for duty cycles greater than 50% follows the same basic theory of operation, but with OUT 40 and OUT* 35 switching to the opposite CMOS levels. Once the output nodes have reached their CMOS levels, the outputs can be sampled, the circuit again set to precharge, the duty cycle of the clock adjusted and sampling may then occur again.

The primary problem with this prior art circuit is that the output state is dependent on the time the precharge signal is de-asserted. If the precharge is de-asserted at the wrong point in time, the sampling circuit is effectively "tipped" in one direction. With reference to FIG. 3, this initial error can be seen by comparing the difference between the voltages on the output nodes, OUT 40 and OUT* 35, during each half of the clock cycle. The voltage $\Delta V_1$ 320 shows the difference between output nodes, OUT 40 and OUT* 35, and voltage $\Delta V_2$ 330 is that same difference half a clock cycle later. The initial error is manifested by the large difference between $\Delta V_1$ and $\Delta V_2$ as can be seen in FIG. 3. This initial error can only be overcome when the error in the duty cycle is of a sufficient size. A larger duty cycle error will allow more current to flow along one side of the sampling circuit during each clock cycle and may be sufficient to eventually overcome the initial error. A smaller duty cycle error would not, however, suffice to overcome this initial error and the sampler will settle with incorrect outputs. Because the timing of the precharge de-assertion is not controlled in any way, this sampler has a very poor worst-case resolution of approximately 10 ps out of a 625 ps cycle time.

Another problem of this sampling circuit is that it can sample phase placement only if the incoming signals are single ended signals. It cannot sample phase placement of two differential clocks since that would require four inputs. Thus, the circuit cannot sample phase placement of differential CML clock signals. For these reasons, the prior art samplers are limited in the precision with which they can sample duty cycle and perform phase placement and are also limited in the speed with which they can do so due to the inherent limitations of the logic families associated with such samplers.

There is therefore a need for a circuit that is capable of sampling duty cycle and phase placement in a manner that yields sufficient accuracy and may be used with differential CML signals.

DETAILED DESCRIPTION OF THE INVENTION

Figure 1:
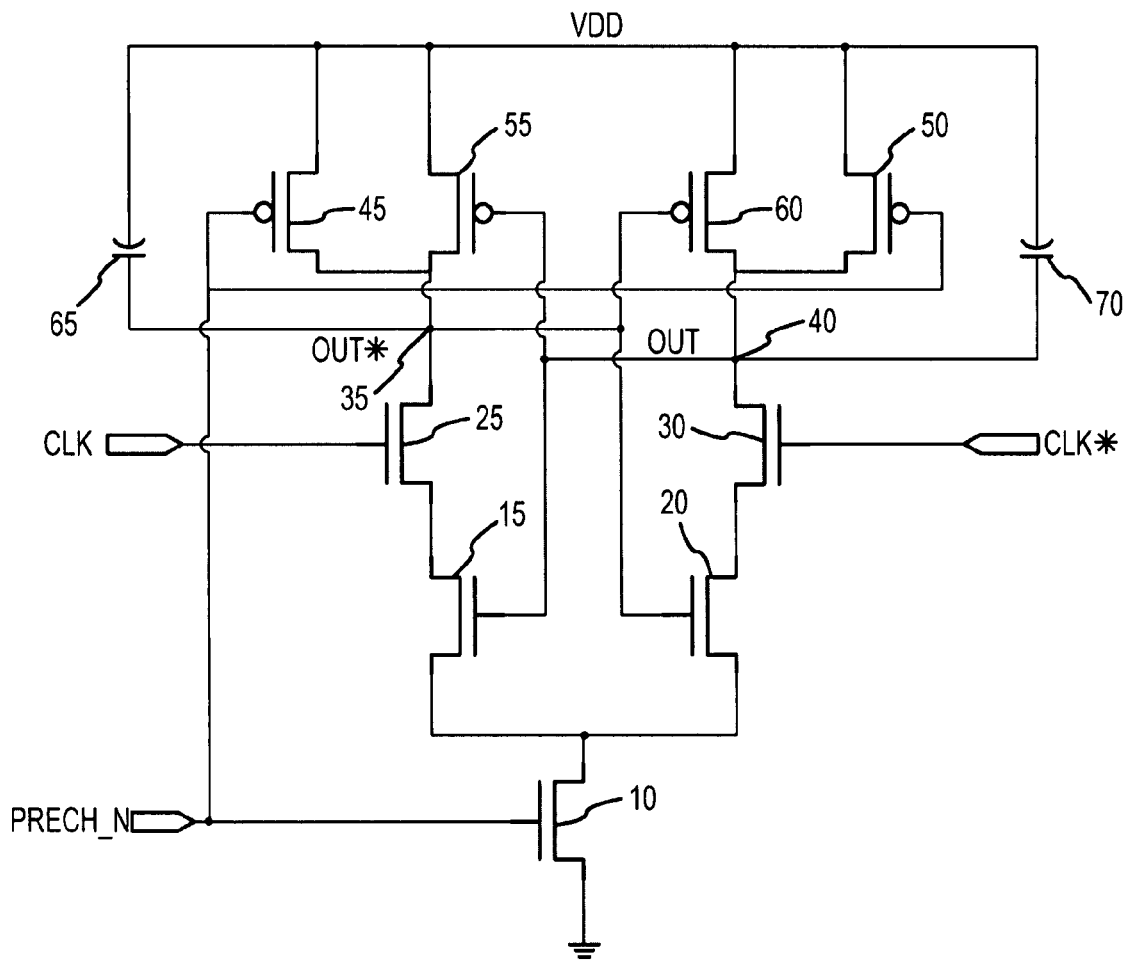
FIG. 1 is a transistor-level schematic of a duty cycle and phase placement sampler according to the prior art.
Figure 2A:
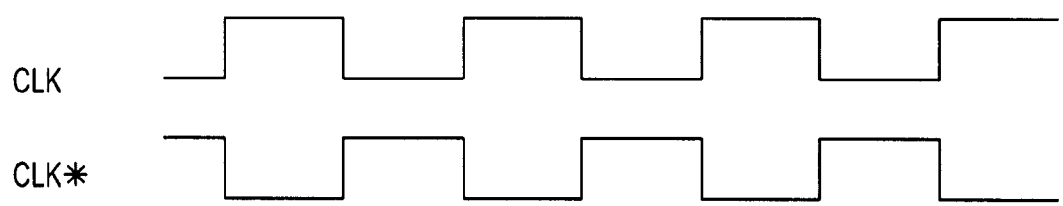
FIGS. 2A and 2B illustrate two sets of complementary clock signals, one set with perfect duty cycle and the other with a duty cycle less than 50%, respectively.
Figure 2B:
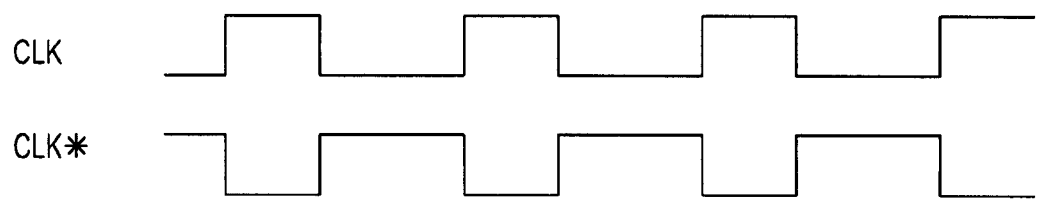
Figure 3:
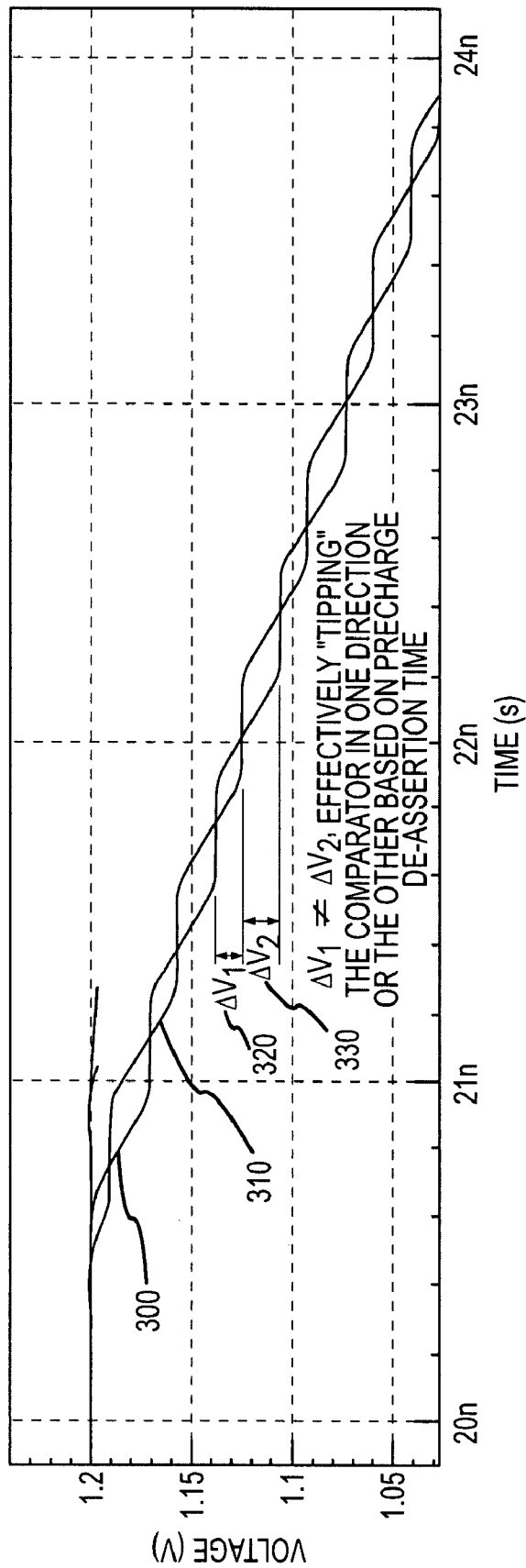
FIG. 3 is a graph of a SPICE simulation illustrating the initial error between the output nodes of the prior art sampler circuit of FIG. 1.
Figure 4:
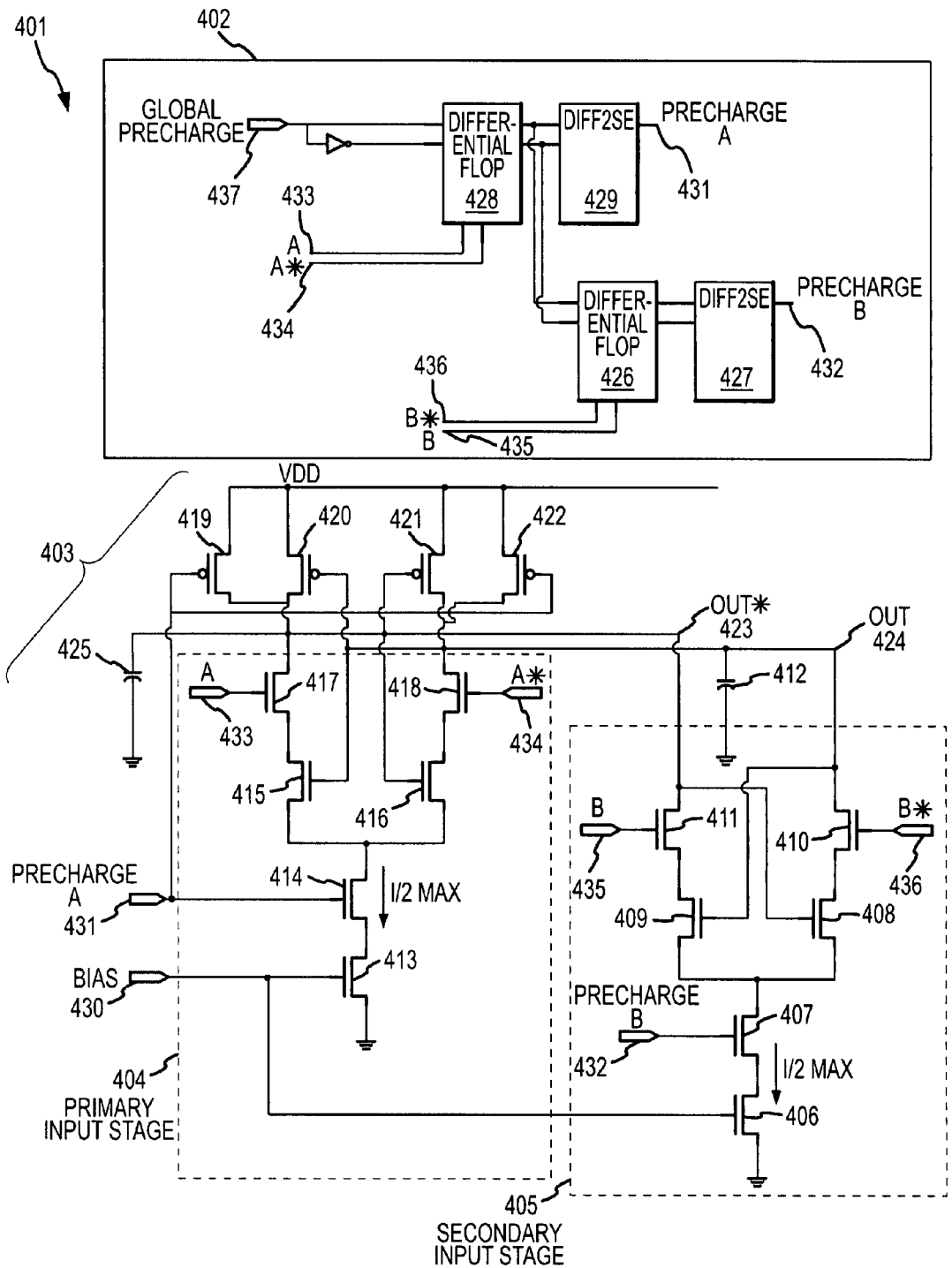
FIG. 4 is a schematic of a duty cycle and phase placement sampler according to one example of the invention.

A duty cycle and phase placement sampling circuit 401 according to one embodiment of the invention is shown in FIG. 4. The circuit comprises a precharge retiming circuit 402 and a differential input sampler 403 with replicated differential pair stages 404 and 405 to accommodate two sets of differential inputs.

With reference to FIG. 4, primary input stage 404 consists of six NMOS transistors. NMOS transistor 413 is a bias transistor which limits the current through the primary input stage 404. This transistor may be biased by a bias signal applied to the BIAS input 430. Such a signal may be provided by, for example, an external current mirror as is understood by those of ordinary skill in the art. Immediately above the bias NMOS 413 is an enable transistor 414 which is controlled by the active-low precharge signal PreChargeA 431. When the PreChargeA signal is asserted, the enable transistor 414 is turned off and prevents current flow through the NMOS 413 down to ground. Immediately above the enable transistor 414 are a pair of feedback NMOS transistors 415 and 416 that are cross-connected to the output nodes OUT 424 and OUT* 423, respectively. Lastly, the primary input stage 404 consists of the differential input transistors 417 and 418. The gates of these transistors are connected to the input terminals A 433 and A* 434, respectively. Except for two small differences, the secondary input stage 405 is identical to the primary input stage 404. The first difference is that the enable transistor 407 is controlled by the active-low precharge signal PreChargeB 432. The other difference is that the input transistors 410 and 411 are connected to input terminals B* 436 and B 435, respectively.

Both differential pair stages are connected to a group of PMOS transistors responsible for precharging the output nodes as well as for providing a pull-up current via the same feedback mechanism as that of the prior art as was discussed above. In particular, the PMOS transistors 419 and 422 are used to precharge the output nodes OUT* 423 and OUT 424, respectively, and the PMOS transistors 420 and 421 are the feedback PMOS transistors.

Lastly, the sampling circuit 401 also includes integrating capacitors 425 and 412 on the output nodes OUT* 423 and OUT 424, respectively, Use of this circuit for duty cycle sampling will now be described. When sampling the duty cycle of a differential clock, only one set of clock signals is needed: the clock and its complement. The circuit as described above, however, has two sets of input terminals. For duty cycle sampling, the clock is simply connected to both input terminals A 433 and B 435. Likewise, the complement of the clock is connected to input terminals A* 434 and B* 436. For the remainder of the description of duty cycle sampling, input terminals A 433 and B 435 are receiving the signal CLK and A* 434 and B* 436 are receiving CLK*.

The operation of this circuit then begins with retiming of the precharge signal via the retiming circuit 402. A global precharge signal 437 and its complement are applied to the input of a primary differential flip-flop 428. Because the primary flip-flop 428 is connected to the A and A* terminals, the primary flip-flop 428 is clocked on the rising edge of the CLK signal. The output of the primary flip-flop 428 is routed to the inputs of the secondary flip-flop 426. The secondary flip-flop 426 is clocked 180 degrees later on the rising edge of CLK*. Connecting the primary and secondary flip-flops 426 and 428 in series ensures that the active-low PreChargeB signal is never de-asserted prior to the PreChargeA signal. If this were allowed to happen, the precharge transistors enabled by the PreChargeA signal would still be conducting at the moment the PreChargeB signal de-asserts and turns on the enable NMOS transistor 432. The differential outputs of the primary and secondary flip-flops 426 and 428 are then fed to differential to single-ended conversion circuits 427 and 429, respectively. The conversion circuits take the intermediate differential precharge signals from each flip-flop and provide single-ended, full CMOS level precharge signals PreChargeA 431 and PreChargeB 432. As a result, the retiming circuit 402 provides two single-ended precharge signals with one being de-asserted one-half cycle after the other.

Operation of the circuit continues with the PreChargeA signal being de-asserted after a sufficient precharge time. When the PreChargeA signal de-asserts, up to ½ of the total current is allowed to flow to ground through the primary input stage 404 as regulated by the bias transistor 413. This current is provided by the integrating capacitors 412 and 425 with the output nodes OUT 423 and OUT* 424 being pulled down according to the signals CLK and CLK* just as with the prior art circuit discussed above. A half a cycle (180 degrees) later, the PreChargeB signal is de-asserted and the other half of the total current is allowed to flow down through the secondary input stage 405. At this point, the operation of the circuit follows that of the prior art circuit discussed above. In particular, the capacitors integrate the duty cycle and the offset between the output nodes, OUT 424 and OUT* 423, pushes a positive feedback mechanism that drives the output nodes to their final levels.

Figure 5:
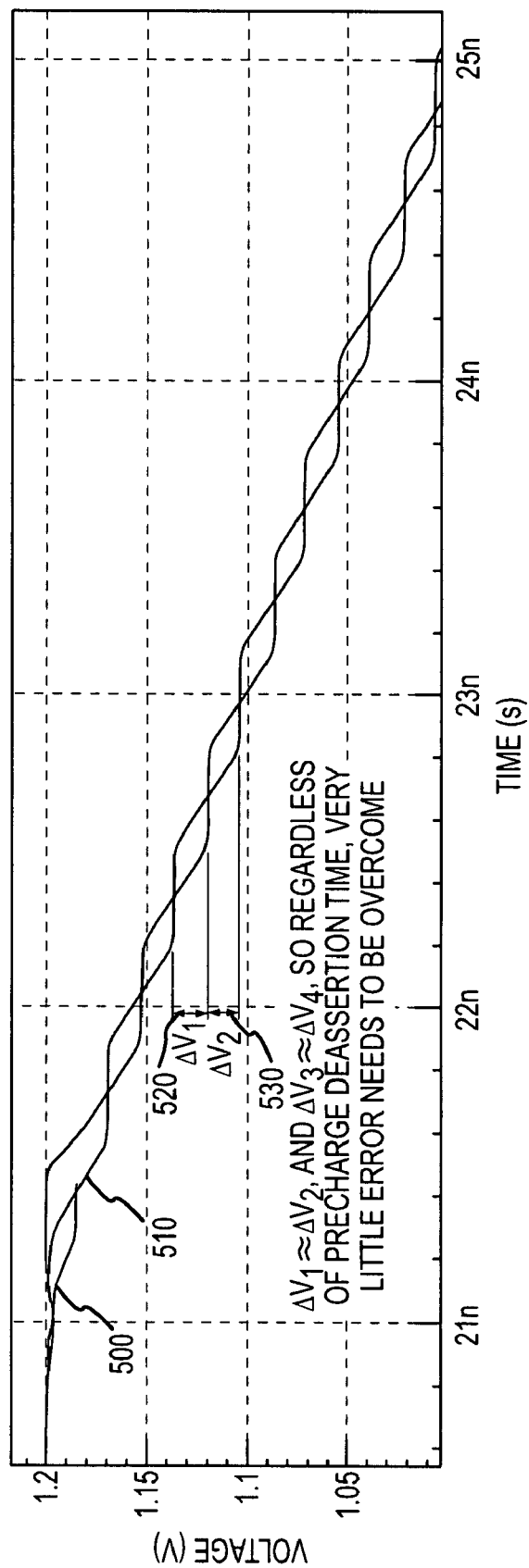
FIG. 5 is a graph of a SPICE simulation illustrating the absence of error between the output nodes of the sampler.

FIG. 5 is a graph of a SPICE simulation illustrating the absence of error between the output nodes of the duty cycle sampler according to one embodiment of the invention. The voltage $\Delta V_1$ 520 is the voltage difference between the output nodes, OUT 424 and OUT* 423, whereas voltage $\Delta V_2$ 530 is that same difference half a clock cycle later. Just as with the prior art circuit discussed above, an error would be manifest itself as a large difference between $\Delta V_1$ and $\Delta V_2$. As is apparent from the graph, $\Delta V_1$ 520 and $\Delta V_2$ 530 are approximately equal and thus there is no initial error in the sampler.

Figure 6:
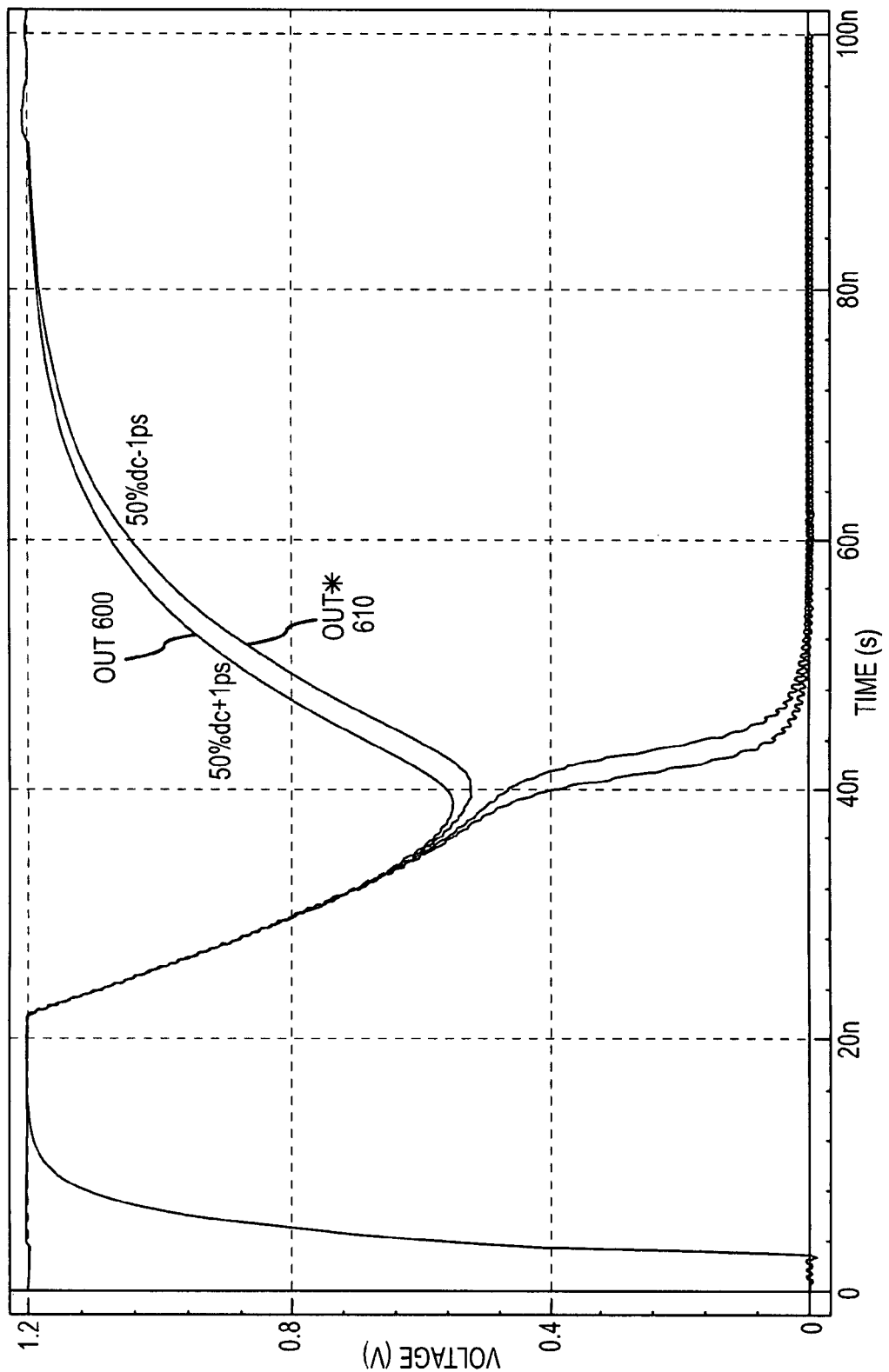
FIG. 6 is a graph of a SPICE simulation illustrating the high accuracy of the duty cycle sampling.

Because the error voltage is virtually non-existent, the sampler is able to resolve very small differences in duty cycle as is illustrated in FIG. 6. FIG. 6 shows that the outputs of the sampler switch to their correct values when the duty cycle varies by only 1 pSec out of a 625 pSec cycle time. The graph signal 600 shows that the output node OUT 424 has switched high with a duty cycle of 50% plus 1 pSec. Likewise, graph signal 610 shows that the output node OUT* 423 switches high with a duty cycle of 50% minus 1 pSec.

Figure 7:
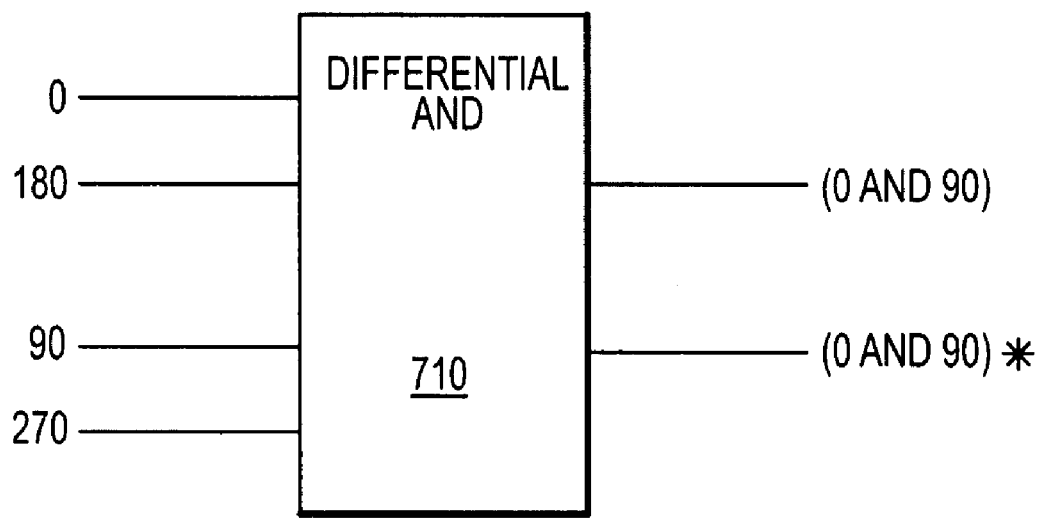
FIG. 7 illustrates a pair of differential AND gates as used for phase placement.
Figure 7:
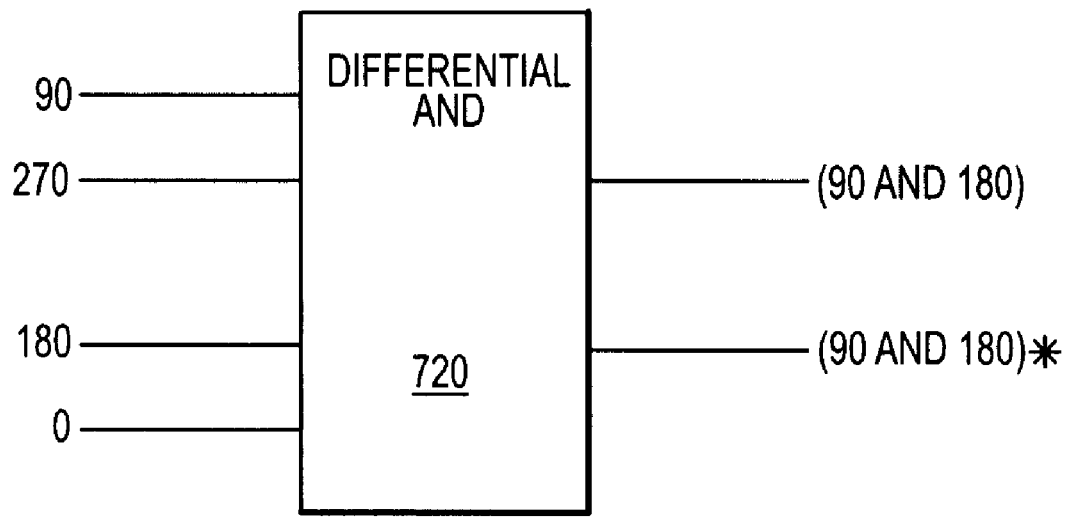

In an alternative embodiment of the invention, the differential sampling circuit 401 and precharge retiming circuit 402 may be combined with a pair of differential AND gates, as illustrated in FIG. 7, and used for phase placement sampling. These gates are used to logically AND various combinations of clock phase signals as will be described in more detail below.

In the forthcoming discussion of phase placement, an 8-phase clock system is assumed. That is, there are 4 differential pair clock phases that need to be aligned. When the phase placement is correct and the phases are aligned, the 4 differential pair phases are: 0 and 180, 45 and 225, 90 and 270, and 135 and 315 degrees. The 0 degree clock phase is typically used as a reference and since its complement is the 180 degree clock phase, it too is a reference. Assuming that all the clock phases have a 50% duty cycle, operation of the circuit for phase placement measurement will now be described.

Figure 8:
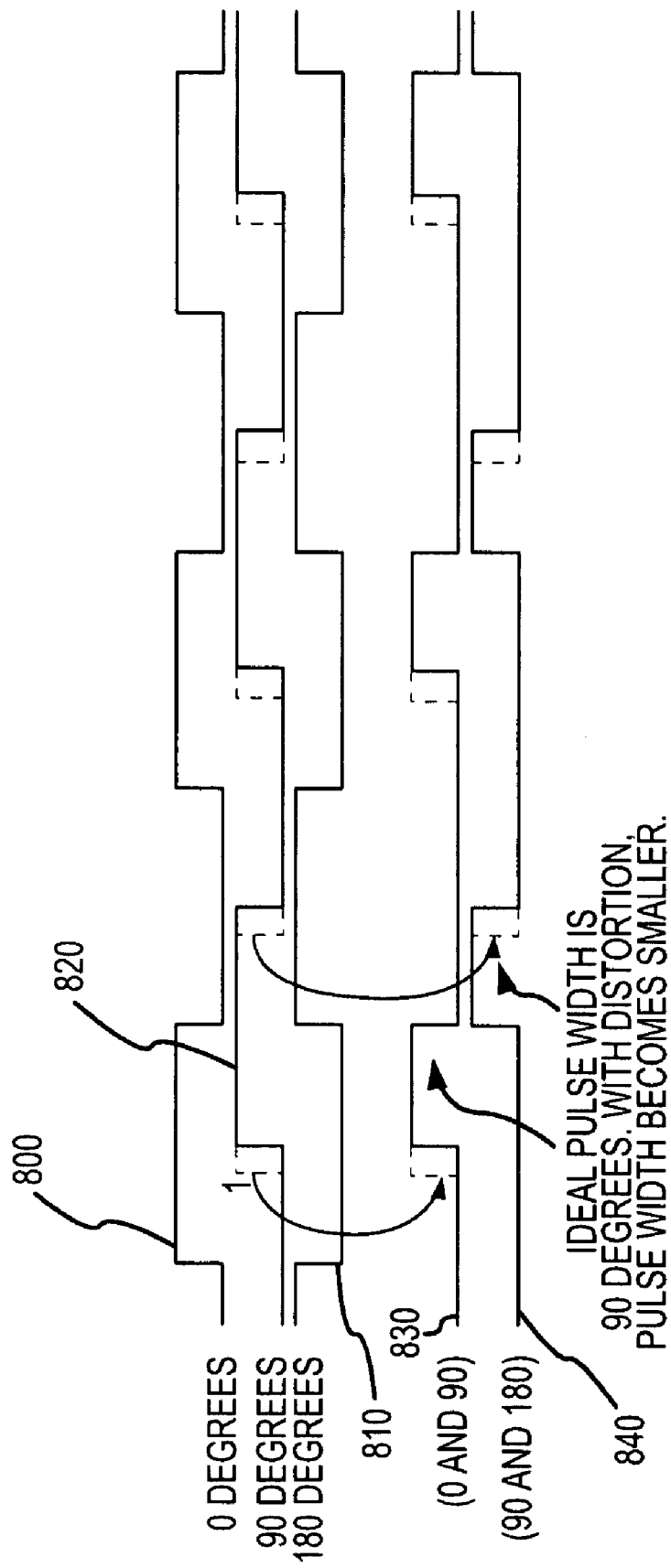
FIG. 8 illustrates a set of clock phase signals as used for phase placement.

FIG. 8 illustrates three of the above described phases: the 0 degree clock phase 800, the 90 degree clock phase 820, and the 180 degree clock phase 810. Although the complement of each of the clock phases is not depicted, it should be understood that the operations on all clock phases are done differentially. Thus every reference to the 90 degree clock phase 820 implicitly references its complement, the 270 degree clock phase. In general, the solid lines of each signal illustrated in FIG. 8 denote ideal signals whereas the dashed lines, where present, denote error or non-ideal signals. As discussed above, the 0 degree clock phase 800 and 180 degree clock phase 810 serve as reference clocks.

With reference to FIG. 8, the solid line of the 90 degree clock phase 820 represents the ideal phase placement for that clock. If the 90 degree clock phase 820 is ideal, then logically AND'ing that clock phase with the 0 degree clock phase 800 and the 180 degree clock phase 810 will yield waveforms with identical, though phase shifted, pulse widths. This is illustrated as the solid lines in the (0 AND 90) signal 830 and the (90 AND 180) signal 840. If the (0 AND 90) signal 830 and its compliment are used as input signals for A 433 and A* 434, respectively, to the differential input sampler 403, and the (90 AND 180) signal 840 and its complement are used as the inputs to B* and B respectively, the output nodes OUT 424 and OUT* 423 will switch unless the pulse widths of the signals exactly match. To understand why this is the case, suppose the 90 degree clock is shifted to the left as illustrated by the dashed line of the 90 degree clock phase 820. Because of the error on the 90 degree clock phase 820, the pulse width of the (0 AND 90) signal 830 is too wide as is evident in the difference between the dashed and solid lines of the signal. Likewise, the (90 AND 180) signal 840 has a pulse width that is too small (also illustrated by the dashed line). Since the (0 AND 90) signal 830 is coupled to the A input 433, the output node OUT* 423 will be pulled down when the (0 AND 90) signal 830 is high. Likewise, because the (90 AND 180) signal 840 is coupled to the B* input 436, the output node OUT 424 will be pulled down when the (90 AND 180) signal 840 is high. In the case where there is no phase placement error, the (0 AND 90) signal will be high for the same amount of time each clock period as that of the (90 AND 180) signal and therefore both of the output nodes OUT 424 and OUT* 423 will be pulled lower by an equal amount each clock period. Alternatively, when there is phase placement error and as a result the pulse widths of the (0 AND 90) and (90 AND 180) signals are different, then one output will be pulled lower for a longer period of time each clock cycle. When integrated over time, this difference accumulates resulting in one of the output nodes being pulled substantially lower than the other. The resulting offset between the output nodes then pushes the positive feedback mechanism and drives the output nodes to their final levels as was described above. The output nodes are then sampled to determine which direction to move, in this example, the 90 degree clock phase. After the clock phase is adjusted, the sampler is reset and the phase may be re-checked and adjusted iteratively.

As will be understood by one of ordinary skill, each and every clock phase can be properly placed by iteratively applying various combinations of the clock phases to the phase placement sampler, making corrections to the respective clock phases and then applying the clock phases again until each phase is correctly placed. Typically, every clock phase is fed to a set of two multiplexers, one for each of the AND gates as shown in FIG. 7. The multiplexers are then used to select inputs to the AND gates from among the 8 clock phases. In this way, the phase placement sampler can be re-used to sample and place each of the required clock phases.

Figure 9:
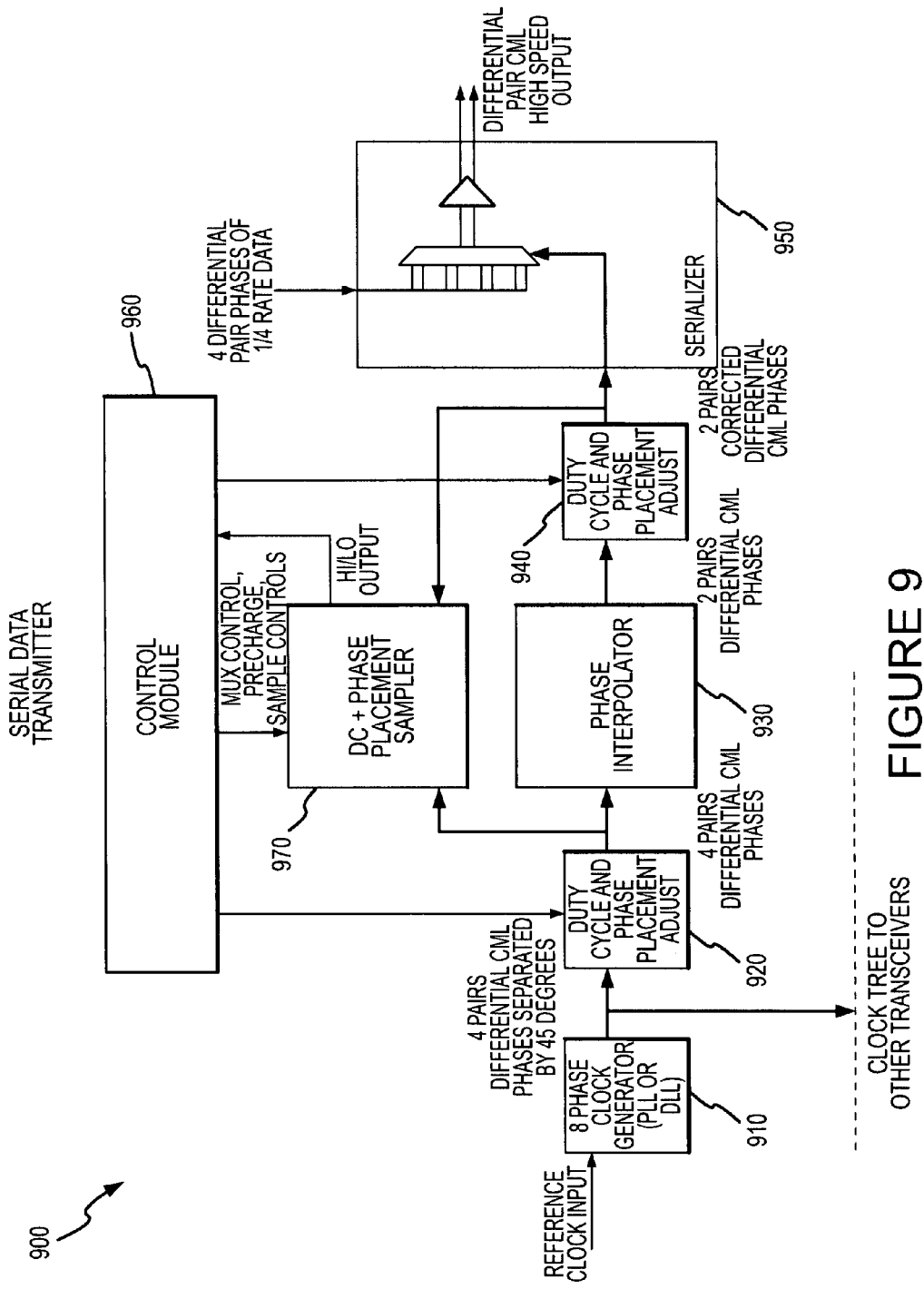
FIG. 9 is a partial functional block diagram illustrating a serial data transmitter including a duty cycle and phase placement sampler according to an embodiment of the invention.

FIG. 9 illustrates an embodiment of the invention as used to generate clock signals in a serial data transmitter. In a typical application of an embodiment of the invention, the duty cycle and phase placement sampler is used to generate a signal that indicates when the duty cycle or phase placement of clock signals is incorrect. This signal is then used to correct the duty cycle or phase placement on the fly. With reference to FIG. 9, a reference clock is input to the serial data transmitter 900 and fed to an 8-phase clock generator 910. The clock generator 910 generates the 4 differential pair clock phase signals discussed above. These differential pair clock signals are fed directly to a duty cycle and phase placement adjustment circuit 920. The adjustment circuit 920 is configured to receive control signals from the control module 960 via a feedback loop described below. The adjustment circuit 920 then adjusts the duty cycle or phase placement of the incoming clock signals as dictated by the control signals from the control module 960. The adjustment circuit 920 outputs 4 differential pair clock phase signals that are duty cycle and phase placement corrected. These clock signals are fed to two locations. First, a feedback loop is initiated by feeding the clock signals into the duty cycle and phase placement sampling circuit 910 that is an embodiment of the invention. The sampling circuit 910 then generates a signal indicative of a duty cycle error or phase placement mismatch that is in turn input to the control module 960. As was discussed above, the control module 960 then generates a control signal according to the error or mismatch signal generated by the sampling circuit 910. This control signal is in turn fed to the adjustment circuit 920 to cause adjustment to the clock phase signals and thus completes the feedback loop.

The clock phase signals from the adjustment circuit 920 are also fed to a phase interpolator 930. As is understood by one of ordinary skill in the art, the phase interpolator is used to adjust the phase of the clocks in very fine increments. In particular, the phase interpolator 930 takes the 4 differential pairs of duty cycle and phase placement corrected clock phase signals from the adjustment circuit 920 and outputs 2 differential pairs of clock phase signals with an appropriate phase adjustment. The duty cycle and phase placement of the incoming signals must be correct to avoid integral non-linearity in the phase interpolator. The differential pairs that are output from the phase interpolator 930 are fed to another adjustment circuit 940. The adjustment circuit 940 forms part of another feedback loop wherein the output of the adjustment circuit 940 is monitored by the duty cycle and phase placement sampler 970 and appropriately adjusted according to control signals created by the control module 960. Any phase placement or duty cycle errors lead directly to output jitter in the serializer 950. The serializer 950 accepts the 2 corrected differential pairs of clock phase signals along with 4 differential pairs of data signals. The data signals arrive at ¼ to total data rate, and are serialized and transmitted at high speed according to the clock phase signals.

Figure 10:
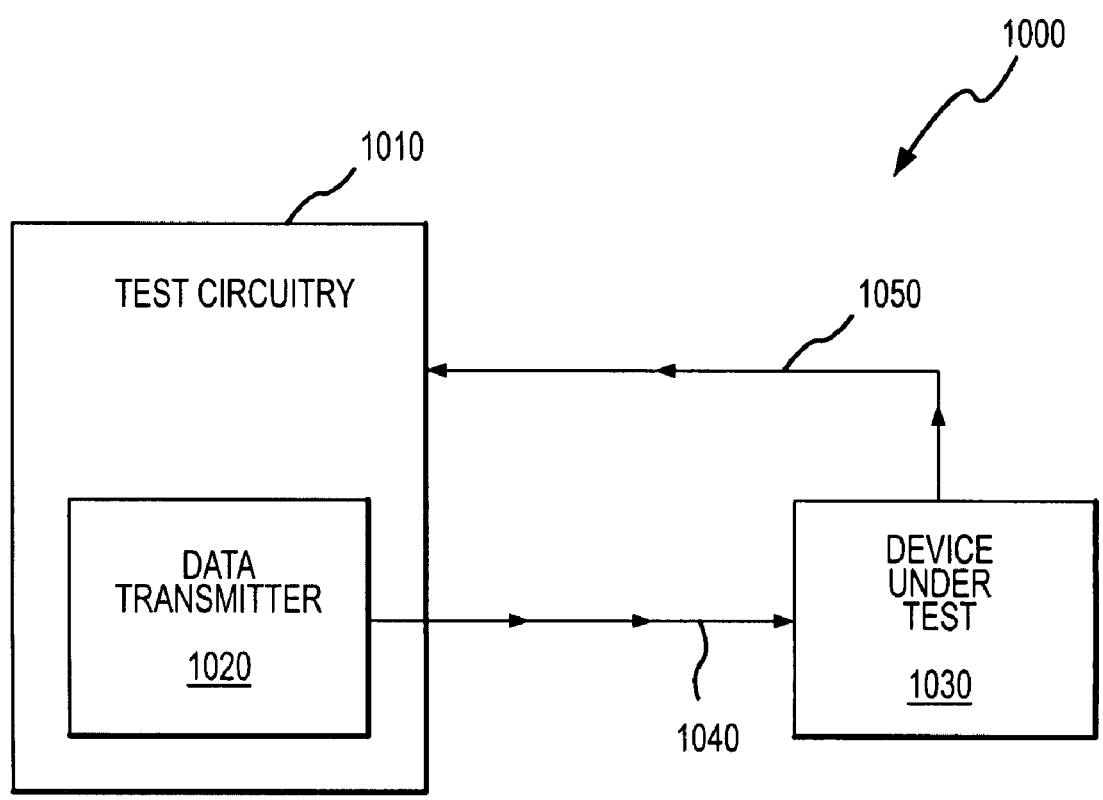
FIG. 10 is a partial functional block diagram illustrating a test system including a serial data transmitter and duty cycle and phase placement sampler according to an embodiment of the invention.

FIG. 10 illustrates an embodiment of the invention as used by a test system 1000. The test system 1000 includes test circuitry 1010. The test circuitry 1010 uses a data transmitter 1020 to serialize test data 1040 sent to a device under test 1030. The device under test 1030 generates response signals 1050 in response to the test data 1040 which are returned to the test circuitry 1010.

From the foregoing it will be appreciated that, although specific embodiments of the invention have been described herein for purposes of illustration, it will be understood by one skilled in the art that various modifications may be made without deviating from the invention. Accordingly, the invention is not limited except as by the appended claims.

What is claimed is:

1. A signal sampling circuit comprising:
    a primary differential input stage to receive a first input signal and a second input signal, the primary differential input stage being enabled responsive to a first control signal to couple a first current through a first output node and couple a second current through a second output node in response to the first and second input signals, respectively, the primary differential input stage being configured to limit the first current according to the voltage of the second output node, to limit the second current according to the voltage of the first output node and to limit the combination of the first current and the second current according to a bias signal;
    a secondary differential input stage to receive a third input signal and a fourth input signal, the secondary differential input stage being enabled by asserting a second control signal to couple a third current through the first output node and couple a fourth current through the second output node in response to the third and fourth input signals, respectively, the secondary differential input stage being configured to limit the third current according to the voltage of the second output node, to limit the fourth current according to the voltage of the first output node and to limit the combination of the third current and the fourth current according to the bias signal;
    first and second pre-charge transistors operable to couple a first voltage to the first output node and to the second output node, respectively, responsive to the first control signal being de-asserted;
    first and second feedback transistors, the first feedback transistor operable to couple the first voltage to the first output node according to the voltage of the second output node and the second feedback transistor operable to couple the first voltage to the second output node according to the voltage of the first output node; and
    first and second integrating capacitors, the first and second integrating capacitors coupled to the first and second output nodes, respectively, and each further configured to be coupled to a second voltage.

2. The signal sampling circuit of claim 1 further comprising:
    a first differential flip-flop to receive a pre-charge signal and its complement as a first set of differential input signals and configured to latch the differential input signals on the rising edge of first input signal to produce a first set of differential output signals;
    a second differential flip-flop to accept the first set of differential output signals from the first differential flip-flop as a second set of differential input signals and configured to latch the second set of differential input signals on the rising edge of the fourth input signal to produce a second set of differential output signals;
    a first differential to single-ended converter configured to convert the first set of differential output signals into a first single-ended output signal; and
    a second differential to single-ended converter configured to convert the second set of differential output signals into a second single-ended output signal.

3. The signal sampling circuit of claim 2 wherein the first single-ended output signal is the first control signal and the second single-ended output signal is the second control signal.

4. The signal sampling circuit of claim 3 further comprising:
    a first differential 2-input AND gate configured to accept a first and second set of differential clock phase signals and logically AND the signals to produce a first output signal and a second output signal wherein the second output signal is the complement of the first output signal; and
    a second differential 2-input AND gate configured to accept a third and fourth set of differential clock phase signals and logically AND the signals to produce a third output signal and a fourth output signal wherein the fourth output signal is the complement of the third output signal.

5. The signal sampling circuit of claim 4 wherein the first, second, third and fourth output signals from the AND gates serve as the first, second, fourth and third input signals, respectively.

6. The signal sampling circuit of claim 5 wherein the first set of differential clock phase signals is selected from among a plurality of complementary clock phase signals.

7. The signal sampling circuit of claim 6 wherein the second set of differential clock phase signals is selected from among a plurality of complementary clock phase signals.

8. A data transmitter system, comprising:
    a clock generator;
    a first clock adjustment module coupled to the clock generator;

a phase interpolator coupled to the first clock adjustment module;

a second clock adjustment module coupled to the phase interpolator;

a control module coupled to the first and second clock adjustment modules and operable to generate a first and a second control signal, the control module further operable to generate correction signals responsive to at least two error signals;

a data serializer coupled to the second clock adjustment module and operable to serialize and transmit data; and a duty cycle and phase placement sampler coupled to the control module by at least a first and a second output node and configured to accept first, second, third and fourth input signals from the first and the second clock adjustment modules, the duty cycle and phase placement sampler operable to assert the at least two error signals on the first and second output nodes, respectively, indicative of duty cycle and phase placement errors, comprising:

a primary differential input stage to receive the first input signal and the second input signal, the primary differential input stage being enabled by asserting the first control signal to couple a first current through the first output node and couple a second current through the second output node in response to the first and second input signals, respectively, the primary differential input stage being configured to limit the first current according to the voltage of the second output node, to limit the second current according to the voltage of the first output node, and to limit the combination of the first current and the second current according to a bias signal;

a secondary differential input stage to receive the third input signal and the fourth input signal, the secondary differential input stage being enabled by asserting the second control signal to couple a third current through first output node- and couple a fourth current through the second output node in response to the third and fourth input signals, respectively, the secondary differential input stage being configured to limit the third current according to the voltage of the second output node, to limit the fourth current according to the voltage of the first output node, and to limit the combination of the third current and the fourth current according to the bias signal;

first and second pre-charge transistors, the first and second pre-charge transistors operable to couple a first voltage to the first output node and to the second output node, respectively, responsive to the first control signal de-asserting;

first and second feedback transistors, the first feedback transistor operable to couple the first voltage to the first output node according to the voltage of the second output node and the second feedback transistor operable to couple the first voltage to the second output node according to the voltage of the first output node; and first and second integrating capacitors, the first and second integrating capacitors coupled to the first and second output nodes, respectively, and each further configured to be coupled to a second voltage.

9. The data transmitter system of claim 8 further comprising:

a first differential flip-flop to receive a pre-charge signal and its complement as a first set of differential input signals and configured to latch the differential input signals on the rising edge of first input signal to produce a first set of differential output signals;

a second differential flip-flop to accept the first set of differential output signals from the first differential flip-flop as a second set of differential input signals and configured to latch the second set of differential input signals on the rising edge of the fourth input signal to produce a second set of differential output signals;

a first differential to single-ended converter configured to convert the first set of differential output signals into a first single-ended output signal; and a second differential to single-ended converter configured to convert the second set of differential output signals into a second single-ended output signal.

10. The data transmitter system of claim 9 wherein the first single-ended output signal is the first control signal and the second single-ended output signal is the second control signal.

11. The data transmitter system of claim 10 further comprising:

a first differential 2-input AND gate configured to accept a first and second set of differential clock phase signals and logically AND the signals to produce a first output signal and a second output signal wherein the second output signal is the complement of the first output signal; and a second differential 2-input AND gate configured to accept a third and fourth set of differential clock phase signals and logically AND the signals to produce a third output signal and a fourth output signal wherein the fourth output signal is the complement of the third output signal.

12. The data transmitter system of claim 11 wherein the first, second, third and fourth output signals from the AND gates serve as the first, second, fourth and third input signals, respectively.

13. The data transmitter system of claim 12 wherein the first and second set of differential clock phase signals is selected from among a plurality of complementary clock phase signals.

14. A clock correction circuit operable to accept a global clock signal and to generate a corrected clock signal, comprising:

a clock generator to accept the global clock signal and operable to generate an internal clock signal from the global clock signal;

a clock adjustment module coupled to the clock generator and operable to generate a corrected clock signal from the internal clock signal responsive to at least one correction signal;

a control module coupled to the clock adjustment module, the control module operable to generate the at least one correction signal responsive to a differential error signal; and a duty cycle and phase placement sampler coupled to the control module by at least a first and a second output node and configured to accept first, second, third and fourth input signals from the clock adjustment module, the duty cycle and phase placement sampler operable to assert the differential error signal on the first and second output nodes indicative of duty cycle and phase placement errors in the input signals, comprising:

a primary differential input stage to receive the first input signal and the second input signal, the primary differential input stage being enabled by asserting a first control signal to couple a first current through the first output node and couple a second current through the second output node in response to the first and second input signals, respectively, the primary differential input stage being configured to limit the first current according to the voltage of the second output node, to limit the second current according to the voltage of the first output node, and to limit the combination of the first current and the second current according to a bias signal;

a secondary differential input stage to receive the third input signal and the fourth input signal, the secondary differential input stage being enabled by asserting a second control signal to couple a third current through first output node and couple a fourth current through the second output node in response to the third and fourth input signals, respectively, the secondary differential input stage being configured to limit the third current according to the voltage of the second output node, to limit the fourth current according to the voltage of the first output node, and to limit the combination of the third current and the fourth current according to the bias signal;

first and second pre-charge transistors operable to couple a first voltage to the first output node and to the second output node, respectively, responsive to the first control signal de-asserting;

first and second feedback transistors, the first feedback transistor operable to couple the first voltage to the first output node according to the voltage of the second output node and the second feedback transistor operable to couple the first voltage to the second output node according to the voltage of the first output node; and first and second integrating capacitors, the first and second integrating capacitors coupled to the first and second output nodes, respectively, and each further configured to be coupled to a second voltage.

15. The clock correction circuit of claim 14 further comprising:

a first differential flip-flop to receive a pre-charge signal and its complement as a first set of differential input signals and configured to latch the differential input signals on the rising edge of first input signal to produce a first set of differential output signals;

a second differential flip-flop to accept the first set of differential output signals from the first differential flip-flop as a second set of differential input signals and configured to latch the second set of differential input signals on the rising edge of the fourth input signal to produce a second set of differential output signals;

a first differential to single-ended converter configured to convert the first set of differential output signals into a first single-ended output signal; and a second differential to single-ended converter configured to convert the second set of differential output signals into a second single-ended output signal.

16. The clock correction circuit of claim 15 wherein the first single-ended output signal is the first control signal and the second single-ended output signal is the second control signal.

17. The clock correction circuit of claim 16 further comprising:

a first differential 2-input AND gate configured to accept a first and second set of differential clock phase signals and logically AND the signals to produce a first output signal and a second output signal wherein the second output signal is the complement of the first output signal; and a second differential 2-input AND gate configured to accept a third and fourth set of differential clock phase signals and logically AND the signals to produce a third output signal and a fourth output signal wherein the fourth output signal is the complement of the third output signal.

18. A test system configured to test a device under test comprising:

testing circuitry operable to generate test data, to receive responses to the test data, and to provide test results based on the responses; and a data transmitter comprising:

a clock generator;

a first clock adjustment module coupled to the clock generator;

a phase interpolator coupled to the first clock adjustment module;

a second clock adjustment module coupled to the phase interpolator;

a control module coupled to the first and second clock adjustment modules and operable to generate a first and a second control signal, the control module further operable to generate correction signals responsive to at least two error signals;

a data serializer coupled to the second clock adjustment module and operable to serialize and transmit the test data to the device under test; and a duty cycle and phase placement sampler coupled to the control module by at least a first and a second output node and configured to accept first, second, third and fourth input signals from the first and the second clock adjustment modules, the duty cycle and phase placement sampler operable to assert the at least two error signals on the first and second output nodes, respectively, indicative of duty cycle and phase placement errors, comprising:

a primary differential input stage to receive the first input signal and the second input signal, the primary differential input stage being enabled by asserting the first control signal to couple a first current through the first output node and couple a second current through the second output node in response to the first and second input signals, respectively, the primary differential input stage being configured to limit the first current according to the voltage of the second output node, to limit the second current according to the voltage of the first output node, and to limit the combination of the first current and the second current according to a bias signal;

a secondary differential input stage to receive the third input signal and the fourth input signal, the secondary differential input stage being enabled by asserting the second control signal to couple a third current through first output node and couple a fourth current through the second output node in response to the third and fourth input signals, respectively, the secondary differential input stage being configured to limit the third current according to the voltage of the second output node, to limit the fourth current according to the voltage of the first output node, and to limit the combination of the third current and the fourth current according to the bias signal;

first and second pre-charge transistors, the first and second pre-charge transistors operable to couple a first voltage to the first output node and to the second output node, respectively, responsive to the first control signal de-asserting;

first and second feedback transistors, the first feedback transistor operable to couple the first voltage to the first output node according to the voltage of the second output node and the second feedback transistor operable to couple the first voltage to the second output node according to the voltage of the first output node; and first and second integrating capacitors, the first and second integrating capacitors coupled to the first and second output nodes, respectively, and each further configured to be coupled to a second voltage.

19. A method for sampling a signal, comprising:

changing a charge on first and second capacitors, the capacitors coupled to first and second output nodes, respectively;

starting at a first time, coupling a first current through the first and second output nodes through a first circuit branch according to a first and a second signal;

starting at a second time, coupling a second current through the first and second output nodes through a second circuit branch according a third and a fourth signal; and driving the first and second output nodes to complementary logic levels, respectively, responsive to detecting a voltage difference between first and second output nodes.

20. The method of claim 19 wherein coupling the first current through the first and second output nodes further comprises:

coupling a portion of the first current through the first output node responsive to the first signal; and coupling a portion of the first current through the second output node responsive to the second signal.

21. The method of claim 20 wherein coupling the second current through the first and second output nodes further comprises:

coupling a portion of the second current through the first output node responsive to the third signal; and coupling a portion of the second current through the second output node responsive to the fourth signal.

22. The method of claim 21 wherein the second time is after the first time.

23. The method of claim 22 further comprising:

logically AND'ing a first and a second differential clock phase signal to provide a first complementary result signal; and logically AND'ing a third and fourth differential clock phase signal to provide a second complementary result signal.

24. The method of claim 23 wherein the first and second signals are the true and complement halves of the first complementary result signal.

25. The method of claim 24 wherein the third and fourth signals are the true and complement halves of the second complementary result signal.

26. The method of claim 25 wherein the first, second, third and fourth differential clock phase signals are selected from among a plurality of complementary clock phase signals.

27. The clock correction circuit of claim 18 wherein the first and second set of differential clock phase signals is selected from among a plurality of complementary clock phase signals.

28. The test system of claim 27 wherein the data transmitter further comprises:

a first differential flip-flop to receive a pre-charge signal and its complement as a first set of differential input signals and configured to latch the differential input signals on the rising edge of first input signal to produce a first set of differential output signals;

a second differential flip-flop to accept the first set of differential output signals from the first differential flip-flop as a second set of differential input signals and configured to latch the second set of differential input signals on the rising edge of the fourth input signal to produce a second set of differential output signals;

a first differential to single-ended converter configured to convert the first set of differential output signals into a first single-ended output signal; and a second differential to single-ended converter configured to convert the second set of differential output signals into a second single-ended output signal.

29. The test system of claim 28 wherein the first and second single-ended output signals of the data transmitter are the first control signal and the second control signals of the data transmitter, respectively.

30. The test system of claim 29 wherein the data transmitter further comprises:

a first differential 2-input AND gate configured to accept a first and second set of differential clock phase signals and logically AND the signals to produce a first output signal and a second output signal wherein the second output signal is the complement of the first output signal; and a second differential 2-input AND gate configured to accept a third and fourth set of differential clock phase signals and logically AND the signals to produce a third output signal and a fourth output signal wherein the fourth output signal is the complement of the third output signal.

31. The test system of claim 30 wherein the first, second, third and fourth output signals from the AND gates serve as the first, second, fourth and third input signals, respectively.

32. The test system of claim 31 wherein the first and second set of differential clock phase signals is selected from among a plurality of complementary clock phase signals.

* * * * *

UNITED STATES PATENT AND TRADEMARK OFFICE
CERTIFICATE OF CORRECTION

PATENT NO.         : 7,514,991 B2
APPLICATION NO.    : 11/811980
DATED              : April 7, 2009
INVENTOR(S)        : Schnarr It is certified that error appears in the above-identified patent and that said Letters Patent is hereby corrected as shown below:

In column 9, line 38, in Claim 8, delete "node-" and insert -- node --, therefor.

In column 14, line 11, in Claim 28, delete "claim 27" and insert -- claim 18 --, therefor.

Signed and Sealed this

Twenty-second Day of September, 2009

David J. Kappos
*Director of the United States Patent and Trademark Office*